United States Patent
Shroff et al.

(10) Patent No.: US 9,112,056 B1
(45) Date of Patent: Aug. 18, 2015

(54) METHOD FOR FORMING A SPLIT-GATE DEVICE

(71) Applicants: Mehul D. Shroff, Austin, TX (US); Mark D. Hall, Austin, TX (US)

(72) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/228,682

(22) Filed: Mar. 28, 2014

(51) Int. Cl.
*H01L 21/336* (2006.01)
*H01L 21/8239* (2006.01)
*H01L 29/66* (2006.01)

(52) U.S. Cl.
CPC ...... *H01L 21/8239* (2013.01); *H01L 29/66825* (2013.01)

(58) Field of Classification Search
CPC ............... H01L 21/82; H01L 21/8239; H01L 21/28273; H01L 21/28282; H01L 21/28008; H01L 29/66545; H01L 29/66825; H01L 29/6681
USPC ........................ 438/257, 258, 261, 266, 287
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |
| 7,202,524 B2 | 4/2007 | Kim et al. | |
| 7,208,793 B2 | 4/2007 | Bhattacharyya | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |

(Continued)

FOREIGN PATENT DOCUMENTS

WO 2009058486 5/2009

OTHER PUBLICATIONS

U.S. Appl. No. 13/441,426, Shroff, M. D., et al., Office Action—Allowance, mailed Jun. 9, 2014.

(Continued)

*Primary Examiner* — Kevin M Picardat

(57) ABSTRACT

A method of forming a semiconductor device in an NVM region and in a logic region uses a semiconductor substrate and includes forming a first layer of a material that can be used as a gate or a dummy gate. An opening is formed in the first layer in the NVM region. The opening is filled with a charge storage layer and a control gate. A select gate, which may be formed from the first layer or from a metal layer, is formed adjacent to the control gate. If it is a metal from a metal layer, the first layer is used to form a dummy gate. A metal logic gate is formed in the logic region by replacing a dummy gate.

20 Claims, 18 Drawing Sheets

(56) References Cited

U.S. PATENT DOCUMENTS

| | | | |
|---|---|---|---|
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny et al. | |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Hall et al. | |
| 8,647,946 B2 | 2/2014 | Tan et al. | |
| 8,679,927 B2 | 3/2014 | Ramkumar et al. | |
| 8,716,089 B1 * | 5/2014 | Hall et al. | 438/287 |
| 2001/0049166 A1 | 12/2001 | Peschiaroli et al. | |
| 2002/0061616 A1 | 5/2002 | Kim et al. | |
| 2003/0022434 A1 | 1/2003 | Taniguchi et al. | |
| 2004/0075133 A1 | 4/2004 | Nakagawa et al. | |
| 2004/0262670 A1 | 12/2004 | Takebuchi et al. | |
| 2005/0145949 A1 | 7/2005 | Sadra et al. | |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1 | 2/2008 | Shimamoto et al. | |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1 | 8/2008 | Yanagi et al. | |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111226 A1 | 4/2009 | Chindalore | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0269893 A1 | 10/2009 | Hashimoto et al. | |
| 2009/0273013 A1 | 11/2009 | Winstead et al. | |
| 2009/0278187 A1 | 11/2009 | Toba | |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1 | 2/2012 | Ariyoshi et al. | |
| 2012/0104483 A1 | 5/2012 | Shroff et al. | |
| 2012/0132978 A1 | 5/2012 | Toba et al. | |
| 2012/0142153 A1 | 6/2012 | Jeong | |
| 2012/0248523 A1 | 10/2012 | Shroff et al. | |
| 2012/0252171 A1 | 10/2012 | Shroff et al. | |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1 | 4/2013 | Ishii et al. | |
| 2013/0137227 A1 | 5/2013 | Shroff et al. | |
| 2013/0171785 A1 | 7/2013 | Shroff et al. | |
| 2013/0171786 A1 | 7/2013 | Shroff et al. | |
| 2013/0178027 A1 | 7/2013 | Hall et al. | |
| 2013/0178054 A1 | 7/2013 | Shroff et al. | |
| 2013/0264633 A1 | 10/2013 | Hall et al. | |
| 2013/0264634 A1 | 10/2013 | Hall et al. | |
| 2013/0267072 A1 | 10/2013 | Hall et al. | |
| 2013/0267074 A1 | 10/2013 | Hall et al. | |
| 2013/0323922 A1 | 12/2013 | Shen et al. | |
| 2013/0330893 A1 * | 12/2013 | Hall et al. | 438/261 |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |

OTHER PUBLICATIONS

U.S. Appl. No. 13/491,771, Office Action mailed Mar. 6, 2014.

Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAlO—SiO2 tunnel layer", Sciencedirect. com, Solid-State Electronics, vol. 61, Issue 1, Jul. 2011, pp. 100-105, http://wwww.sciencedirect.com/science/article/pii/S0038110111000803.

Krishnan, S., et al., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., "Dual Metal Gates with Band-Edge Work Functions on Novel HfLaO High-K Gate Dielectric", IEEE, Symposium on VLSI Technology Digest of Technical Papers, 2006.

U.S. Appl. No. 13/402,426, Office Action—Allowance—May 3, 2013.

U.S. Appl. No. 13/789,971, Office Action—Allowance—May 15, 2013.

(56) References Cited

OTHER PUBLICATIONS

U.S. Appl. No. 13/491,771, Office Action—Rejection, Sep. 9, 2013.
U.S. Appl. No. 13/442,142, Office Action—Ex Parte Quayle, Apr. 4, 2013.
U.S. Appl. No. 13/442,142, Office Action—Allowance, Aug. 2, 2013.
U.S. Appl. No. 13/907,491, Office Action—Rejection, Sep. 3, 2013.
U.S. Appl. No. 12/915,726, Office Action—Restriction, Jul. 31, 2012.
U.S. Appl. No. 12/915,726, Office Action—Allowance, Dec. 10, 2012.
U.S. Appl. No. 13/781,727, Office Action—Rejection, Aug. 22, 2013.
U.S. Appl. No. 13/077,491, Office Action—Rejection, Aug. 15, 2012.
U.S. Appl. No. 13/077,491, Office Action—Rejection, Feb. 6, 2013.
U.S. Appl. No. 13/077,491, Office Action—Allowance, Jun. 18, 2013.
U.S. Appl. No. 13/077,501, Office Action—Allowance, Nov. 26, 2012.
U.S. Appl. No. 13/313,179, Office Action—Rejection, Aug. 15, 2013.
U.S. Appl. No. 13/307,719, Office Action—Allowance, May 29, 2013.
U.S. Appl. No. 13/343,331, Office Action—Rejection, Mar. 13, 2013.
U.S. Appl. No. 13/343,331, Office Action—Allowance, Jun. 24, 2013.
U.S. Appl. No. 13/441,426, Office Action—Allowance, Sep. 9, 2013.
U.S. Appl. No. 13/780,574, Office Action—Allowance, Sep. 6, 2013.
U.S. Appl. No. 13/491,760, Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A. H., et al., "Non-Volatile Memory (NVM) and High-K and Metal Gate Integration Using Gate-Last Methodology", filed Sep. 30, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.
U.S. Appl. No. 13/928,666, Hong, C. M., et al., "Non-Volatile Memory (NVM) and High Voltage Transistor Integration", filed Jun. 27, 2013.
U.S. Appl. No. 14/023,440, Baker, F.K., Jr., et al., "Non-Volatile Memory (NVM) Cell and High-K and Metal Gate Transistor Integration", filed Sep. 10, 2013.
U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.
U.S. Appl. No. 13/973,549, Hong, C.M., et al., "Split-Gate non-Volatile Memory (NVM) Cell and Device Structure Integration", filed Aug. 22, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
U.S. Appl. No. 13/781,727, Office Action—Restriction, Jun. 21, 2013.
U.S. Appl. No. 13/780,591, Office Action—Allowance, Nov. 22, 2013.
U.S. Appl. No. 13/790,225, Office Action—Allowance, Dec. 24, 2013.
U.S. Appl. No. 13/790,014, Office Action—Allowance, Dec. 24, 2013.
U.S. Appl. No. 13/442,142, Office Action—Allowance, Dec. 31, 2013.
U.S. Appl. No. 13/491,771, Office Action—Allowance, Jan. 16, 2014.
U.S. Appl. No. 13/781,727, Office Action—Allowance, Jan. 31, 2014.
U.S. Appl. No. 13/441,426, Office Action—Allowance, Feb. 21, 2014.
U.S. Appl. No. 13/442,142, Office Action—Allowance, Feb. 28, 2014.
U.S. Appl. No. 13/790,014, Office Action—Allowance, Mar. 3, 2014.
U.S. Appl. No. 13/907,491, Office Action—Allowance, Mar. 11, 2014.
U.S. Appl. No. 13/790,225, Office Action—Allowance, Mar. 12, 2014.
U.S. Appl. No. 13/781,727, Office Action—Allowance, May 12, 2014.
U.S. Appl. No. 13/343,331, Office Action—Allowance, Nov. 8, 2013.
U.S. Appl. No. 14/195,299, Shroff, M., et al., "Method of Making a Logic Transistor and a Non-Volatile Memory (NVM) Cell", filed Mar. 3, 2014.
Notice of Allowance mailed May 12, 2014 for U.S. Appl. No. 13/780,591 3 pages.
Notice of Allowance mailed Nov. 13, 2014 for U.S. Appl. No. 13/780,591 7 pages.
Non-Final Rejection mailed Dec. 26, 2014 for U.S. Appl. No. 13/661,157, 9 pages.
Restriction Requirement mailed Feb. 9, 2015 for U.S. Appl. No. 14/041,647 5 pages.
U.S. Appl. No. 14/195,299, filed Mar. 3, 2014, entitled "Method of Making a Logic Transistor and Non-Volatile Memory (NVM) Cell".
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action—Allowance, mailed Oct. 17, 2014.
Non-Final Rejection mailed Apr. 30, 2015 for U.S. Appl. No. 14/195,299, 7 pages.
Notice of Allowance mailed Apr. 24, 2015 for U.S. Appl. No. 13/661,157, 8 pages.
Notice of Allowance mailed Jun. 10, 2015 for U.S. Appl. No. 14/041,647, 9 pages.

* cited by examiner

US 9,112,056 B1

METHOD FOR FORMING A SPLIT-GATE DEVICE

BACKGROUND

1. Field

This disclosure relates generally to semiconductor processing, and more specifically, to a method for forming a split-gate device.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with CMOS (complementary metal oxide semiconductor), the CMOS process may be modified to include the process steps necessary to fabricate the NVM cell and the supporting devices.

Flash NVM is commonly embedded in, for example, system-on-a-chip (SoC) integrated circuits having CMOS logic circuitry. The flash NVM may include a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed a NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell and a logic transistor efficiently integrates NVM and logic on a single integrated circuit. This integration allows for flexibility in the choice of materials for the dielectrics and gate materials of the logic gate stack and the select gate stack. In one embodiment, a high-k first metal gate last replacement process may be used to form a high-k dielectric and metal gate for the logic gate and select gate. In another embodiment, a high-k first metal gate last replacement process may be used to form a high-k dielectric and metal gate for the logic gate, while allowing the select gate to remain polysilicon over a high-k dielectric. In another embodiment, a high-k first metal gate last replacement process may be used to form a high-k dielectric and metal gate for the logic gate stack, while allowing the select gate to remain as polysilicon over a thermal oxide dielectric. These embodiments will be better understood by reference to the drawings and the following description.

Figure 1:
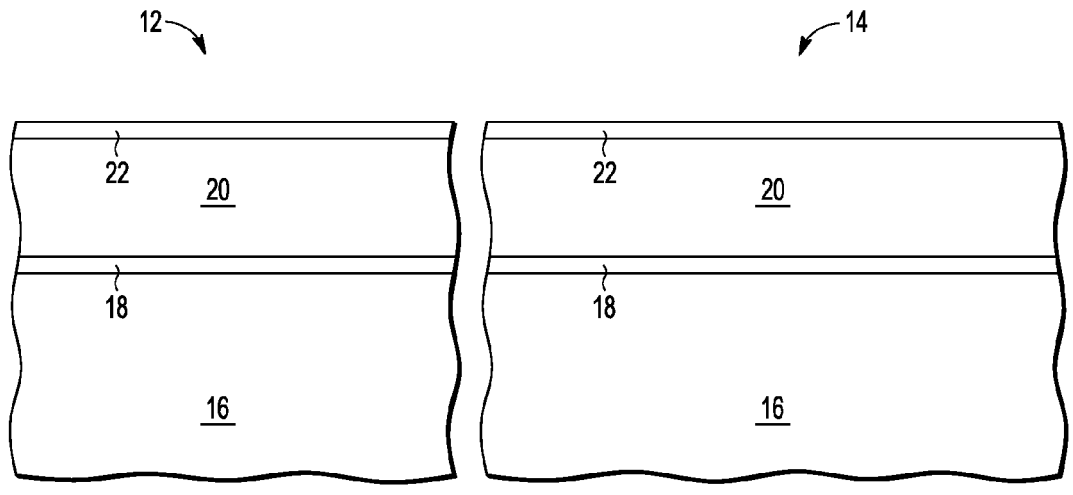
FIGS. 1-13 illustrate, in cross-sectional views, a semiconductor device at various processing stages in accordance with one embodiment of the present invention.

FIG. 1 illustrates, in cross-sectional form, a semiconductor device 10 having a logic region 12 and an NVM region 14 with a substrate 16, a dielectric layer 18 that may be thermal oxide formed on substrate 16, a layer 20 of gate material that may be polysilicon formed on dielectric layer 18, and a hard mask 22 that may be nitride formed on layer 20. Dielectric layer 18 may be an oxynitride. Hard mask 22 is beneficial but may not be required in some situations. Semiconductor substrate 16 can be any semiconductor material or combinations of materials, such as gallium arsenide, silicon germanium, silicon-on-insulator (SOI), silicon, monocrystalline silicon, the like, and combinations of the above.

Figure 2:
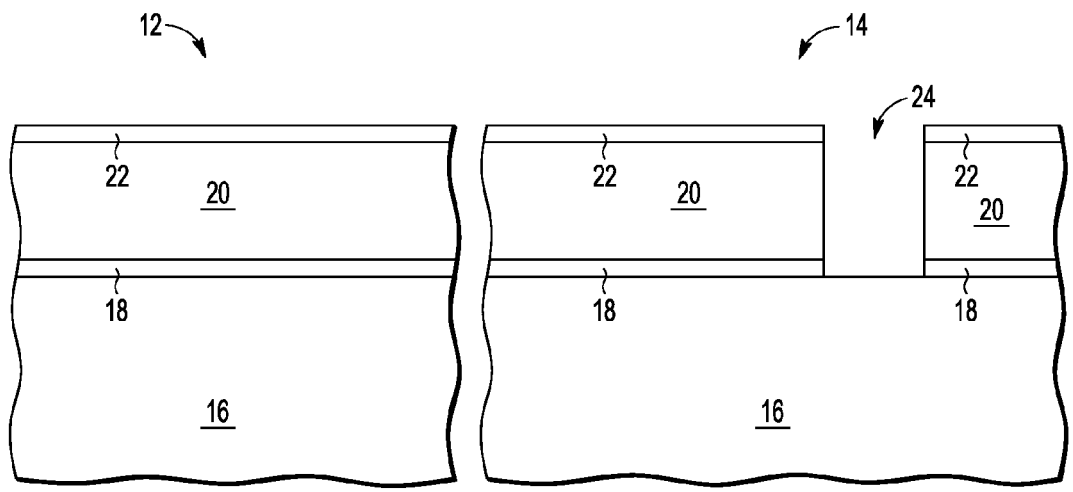

FIG. 2 illustrates, in cross-sectional form, semiconductor device 10 after forming a control gate opening 24 through hard mask 22, layer 20, and dielectric layer 18. Opening 24 is shown stopping at the top surface of substrate 16, but it may extend into substrate 16.

Figure 3:
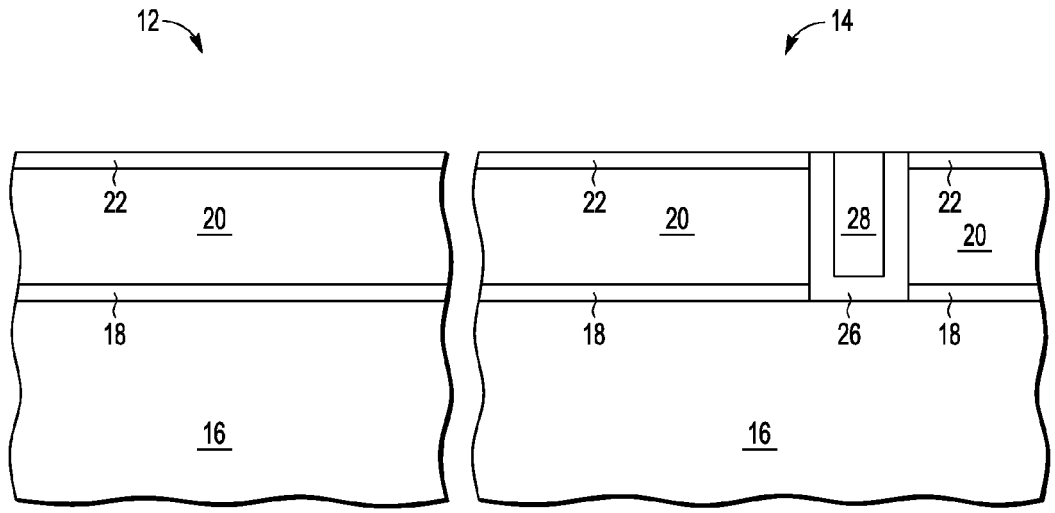

FIG. 3 illustrates, in cross-sectional form, semiconductor device 10 after forming a charge storage layer 26 and a control gate 28 on charge storage layer 26 in opening 24. Charge storage layer 26 may be a layer of nanocrystals surrounded by an insulating material such as oxide and may be formed by bottom grown or deposited dielectric, silicon deposition and anneal that forms nanocrystals, and deposited top dielectric. This may be followed by depositing a layer of control gate material and performing a planarizing step that may be an etchback or chemical mechanical polishing (CMP).

Figure 4:
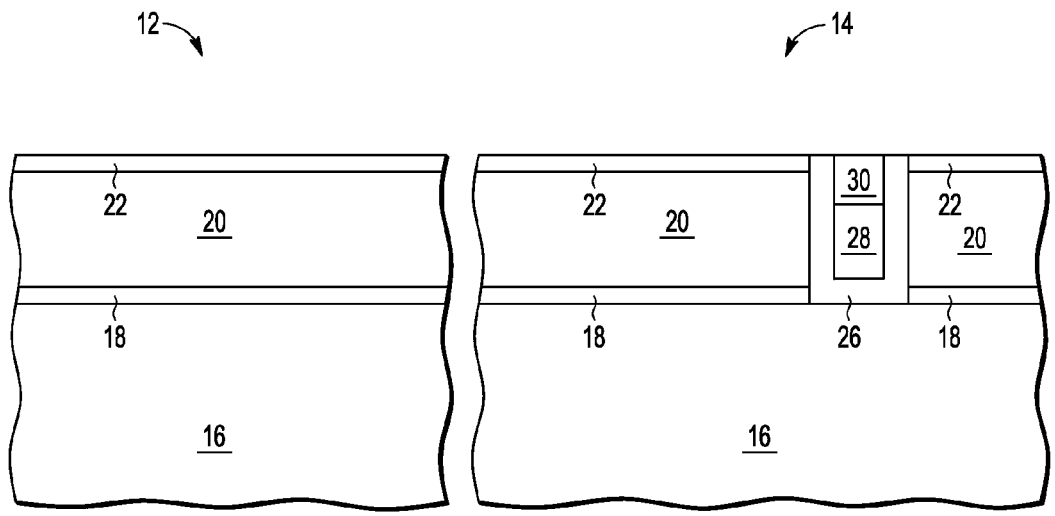

FIG. 4 illustrates, in cross-sectional form, semiconductor device 10, for the case where control gate 28 is formed from polysilicon, after performing a silicidation step which results in a metal silicide 30 in a top layer of control gate 28. The silicidation step may be performed by applying a layer of nickel, applying heat to form nickel silicide on the top portion of control gate 28, and then removing the nickel that was not on polysilicon. If control gate 28 is formed from a layer that itself is metallic, the silicidation step is not needed. In either case, the result is that the top surface of control gate 28 is metallic. Control gate 28 thus has an etch selectivity to layer 20 either due to the surface of control gate 28 being metallic or control gate 28 being entirely metallic.

Figure 5:
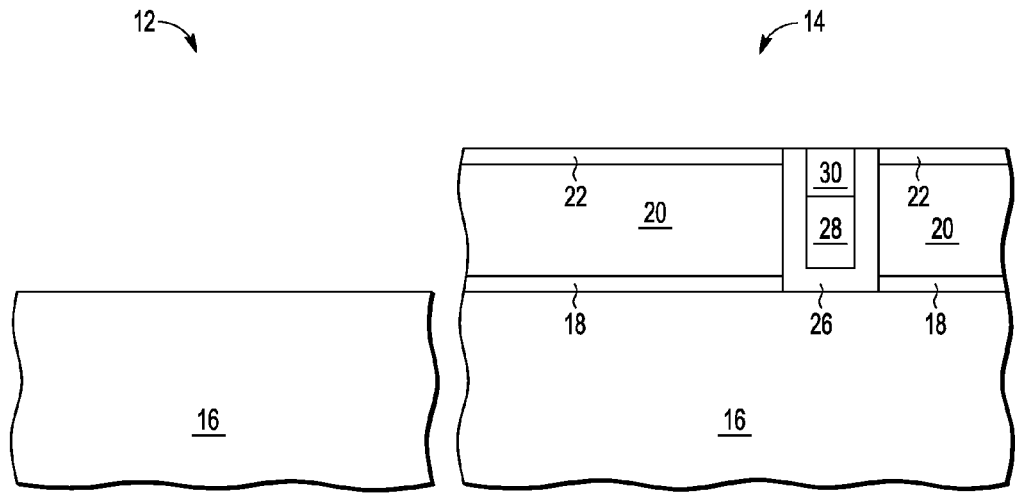

FIG. 5 illustrates, in cross-sectional form, semiconductor device 10, after removal of hard mask 22, layer 20, and dielectric 18 from logic region 12. Hard mask 22 is patterned to remove hard mask 22 from logic region 12. An etch may then be performed to remove layer 20 and dielectric 18 from logic region 12 while hard mask 22 protects layer 20 in NVM region 14.

Figure 6:
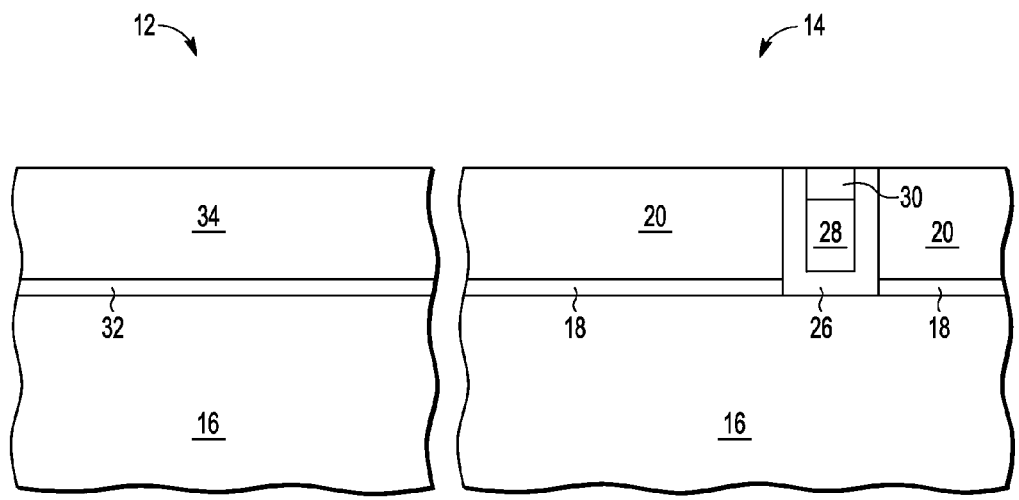

FIG. 6 illustrates, in cross-sectional form, semiconductor device 10 after formation of a high-k dielectric and barrier layer 32 over substrate 16 in logic region 12 and a dummy gate layer 34 over high-k dielectric and barrier layer 32 in logic region 12. In one embodiment, a high-k dielectric layer is formed over substrate 16 in logic region 12 and over hard mask 22 in NVM region 14, and a barrier layer is formed over the high-k dielectric layer. A CMP or etchback may then be performed to remove these layers from NVM region 14. The CMP or etchback may also remove hard mask 22 and a top portion of metal silicide 30 in NVM region 14. In alternate embodiments, hard mask 22 may be removed later in the process.

Figure 7:
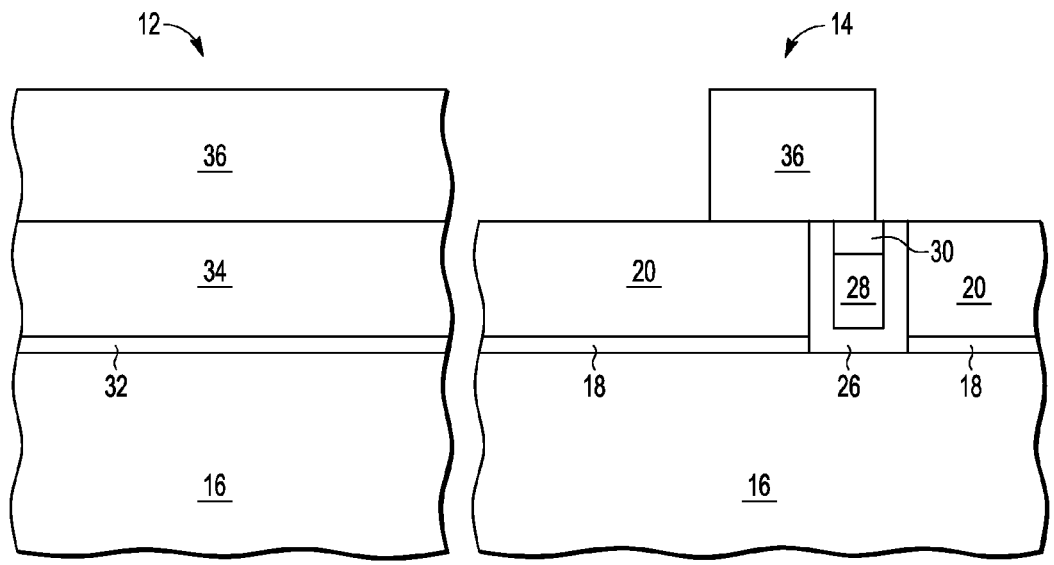

FIG. 7 illustrates, in cross-sectional form, semiconductor device 10 after forming a patterned masking layer 36 over layer 20. Patterned masking layer 36 includes a first portion which covers logic region 12 and a second portion in NVM region 14 which defines the location of a select gate adjacent a control gate. That is, note that the left edge of the second portion defines the location of a left edge of the select gate, and the right edge of the second portion defines the location of a right edge of the control gate, as will be described in further detail below. That is, note that patterned masking layer 36 extends from a first edge (e.g. the right edge) which is over the control gate to a second edge (e.g. the left edge), in which the second edge is spaced from the left edge of opening 24 which now contains charge storage layer 26 and control gate 28.

Figure 8:
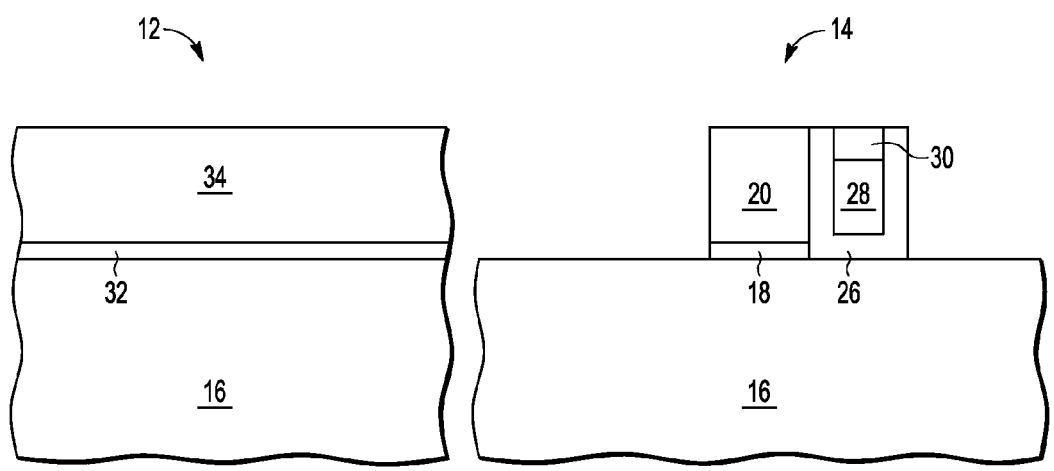

FIG. 8 illustrates, in cross-sectional form, semiconductor device 10 after patterning layer 20 in NVM region 14 using patterned masking layer 36 while layer 34 remains protected in logic region 12. Therefore, in NVM region 14, a portion of gate layer 20 remains adjacent control gate 28. This remaining portion of layer 20 may function as a select gate and may therefore be referred to as select gate 20. Note that a portion of charge storage layer 26 is located between adjacent sidewalls of select gate 20 and control gate 28. Dielectric layer 18 not covered by remaining portions of layer 20 is shown as being removed but it could remain at this point and get removed in subsequent sidewall spacer formation and associated processing.

Figure 9:
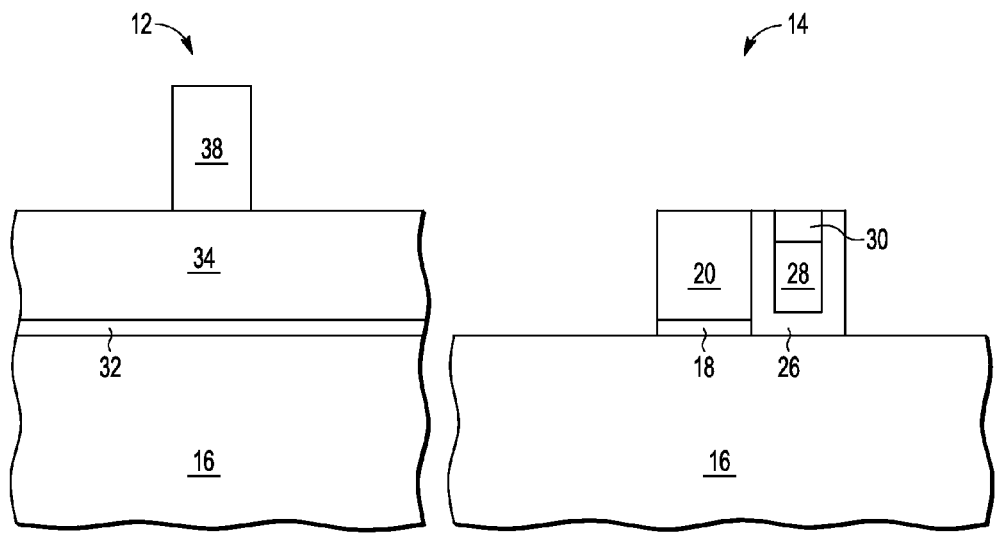

FIG. 9 illustrates, in cross-sectional form, semiconductor device 10 after forming a patterned masking layer 38 over dummy gate layer 34 in logic region 12. Patterned masking layer 38 defines the location of a dummy gate to be formed in logic region 12. Note that a masking layer may be present over select gate 20 and control gate 28 in NVM region 14.

Figure 10:
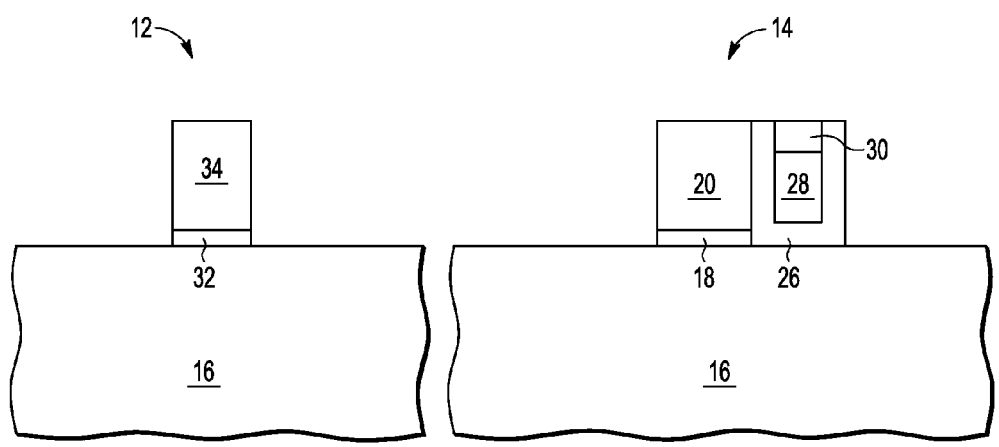

FIG. 10 illustrates, in cross-sectional form, semiconductor device 10 after patterning dummy gate layer 34 in logic region 12 using patterned masking layer 38 while select gate 20 and control gate 28 remain protected. The remaining portion of layer 34 functions as a dummy logic gate, and may therefore be referred to as dummy gate 34. High-k dielectric layer 32 not covered by the remaining portion of layer 34 may be removed at this point or during subsequent processing.

Figure 11:
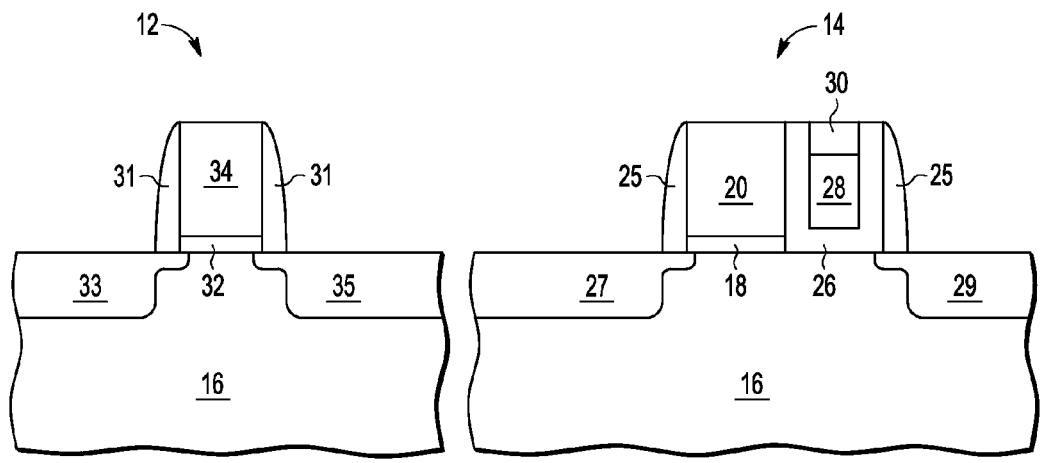

FIG. 11 illustrates, in cross-sectional form, semiconductor device 10 after formation of a sidewall spacer 31 around dummy gate 34, source/drain regions 33 and 35 in substrate 16 adjacent dummy gate 34, sidewall spacer 25 around the select and control gates, source/drain region 27 in substrate 16 adjacent select gate 20, and source/drain region 29 in substrate 16 adjacent control gate 28. In one embodiment, a shallow implant is performed into substrate 16 to form extension regions of each of source/drain regions 33, 35, 27, and 29. Subsequently, spacers 31 and 25 may be formed by depositing a layer of dielectric material and then performing an anisotropic etch. After formation of spacers 31 and 25, a deep implant may be performed into substrate 16 to form source/drain regions 33, 35, 27, and 29.

Figure 12:
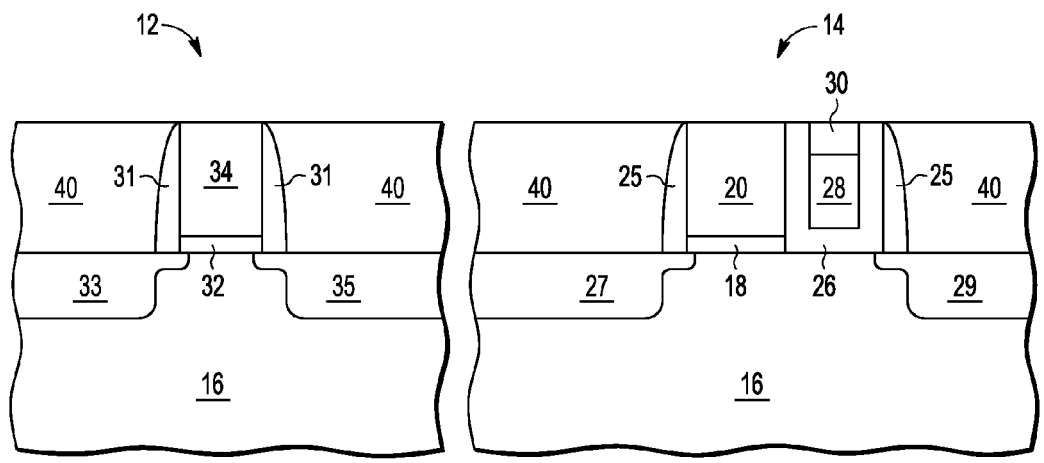

FIG. 12 illustrates, in cross-sectional form, semiconductor device 10 after formation of an interlayer dielectric (ILD) 40 around dummy gate 34 in logic region 12 and the select and control gates in NVM region 14. ILD 40 is planarized to be coplanar with top surfaces of dummy gate 34, select gate 20, and control gate 28, thus exposing dummy gate 34. ILD 40 may be, for example, a low-k material or an oxide.

Figure 13:
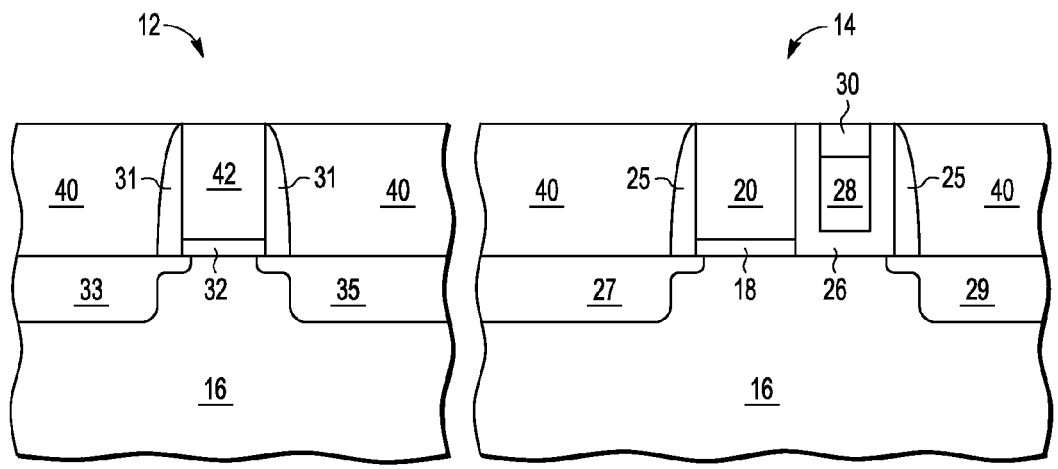

FIG. 13 illustrates, in cross-sectional form, semiconductor device 10 after replacing dummy gate 34 with a metallic logic gate 42. In one embodiment, a metal layer may be formed over ILD 40 and within the opening resulting from the removal of dummy gate 34, followed by an etchback or CMP to result in metallic logic gate 42. Therefore, high-k first metal gate last replacement process may be used to form a high-k dielectric and metal gate for the logic gate while allowing the select gate to remain polysilicon.

Figure 14:
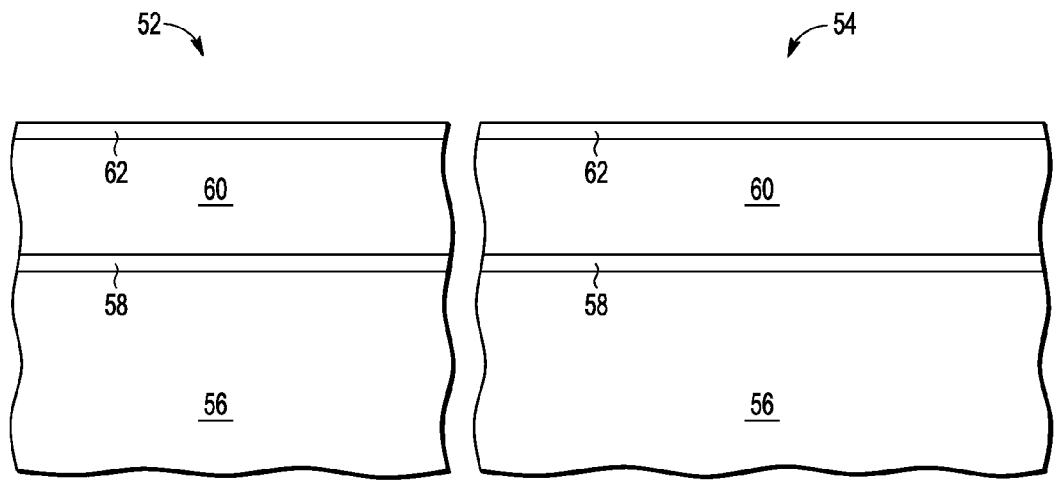
FIGS. 14-22 illustrate, in cross-sectional view, a semiconductor device at various processing stages in accordance with one embodiment of the present invention.

FIG. 14 illustrates, in cross-sectional form, a semiconductor device 50 having a logic region 52 and an NVM region 54 with a substrate 56, a high-k dielectric and barrier layer 58 formed on substrate 56, a layer 60 of dummy gate material that may be polysilicon formed on high-k dielectric and barrier layer 58, and a hard mask 62 that may be nitride formed on layer 60. Hard mask 62 is beneficial but may not be required in some situations. In one embodiment, a high-k dielectric layer is formed over substrate 56 in logic region 52 and NVM region 54, and a barrier layer is formed over the high-k dielectric layer such that the barrier layer is between the high-k dielectric layer and layer 60. The high-k dielectric layer may be an oxynitride. Semiconductor substrate 56 can be any semiconductor material or combinations of materials, such as gallium arsenide, silicon germanium, silicon-on-insulator (SOI), silicon, monocrystalline silicon, the like, and combinations of the above.

Figure 15:
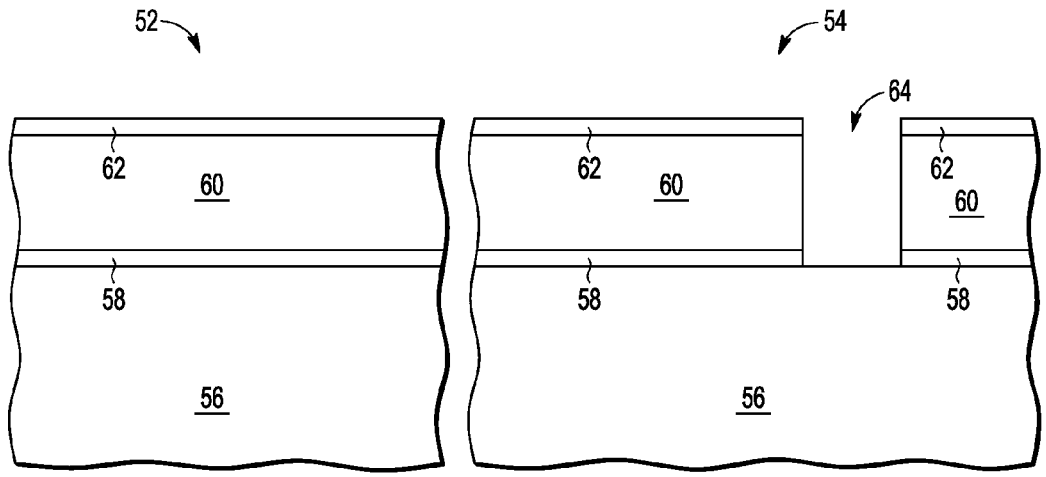

FIG. 15 illustrates, in cross-sectional form, semiconductor device 50 after forming a control gate opening 64 through hard mask 62, layer 60, and high-k dielectric and barrier layer 58. Opening 64 is shown stopping at the top surface of substrate 56, but it may extend into substrate 56.

Figure 16:
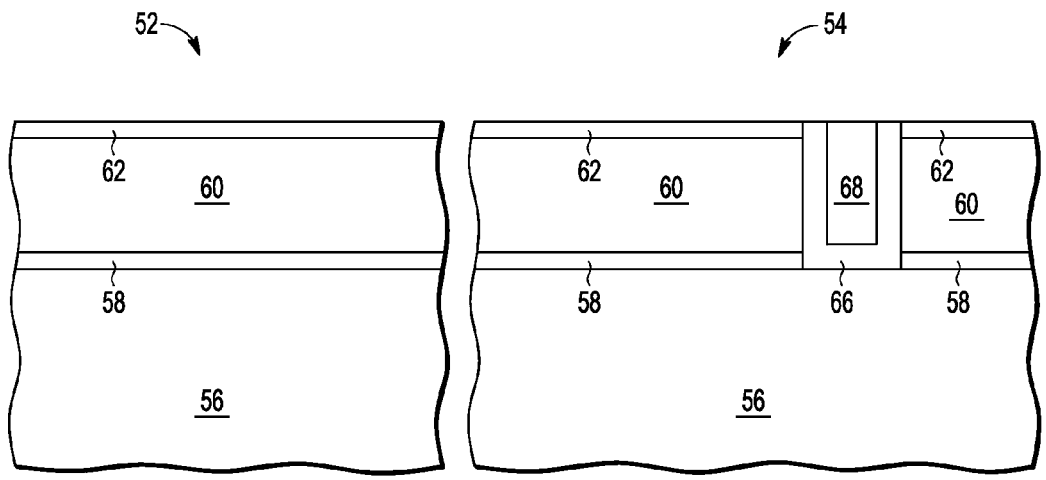

FIG. 16 illustrates, in cross-sectional form, semiconductor device 50 after forming a charge storage layer 66 and a control gate 68 on charge storage layer 66 in opening 64. Charge storage layer 66 may be a layer of nanocrystals surrounded by an insulating material such as oxide and may be formed by bottom grown or deposited dielectric, silicon deposition and anneal that forms nanocrystals, and deposited top dielectric. This may be followed by depositing a layer of control gate material and performing a planarizing step that may be an etchback or chemical mechanical polishing (CMP).

Figure 17:
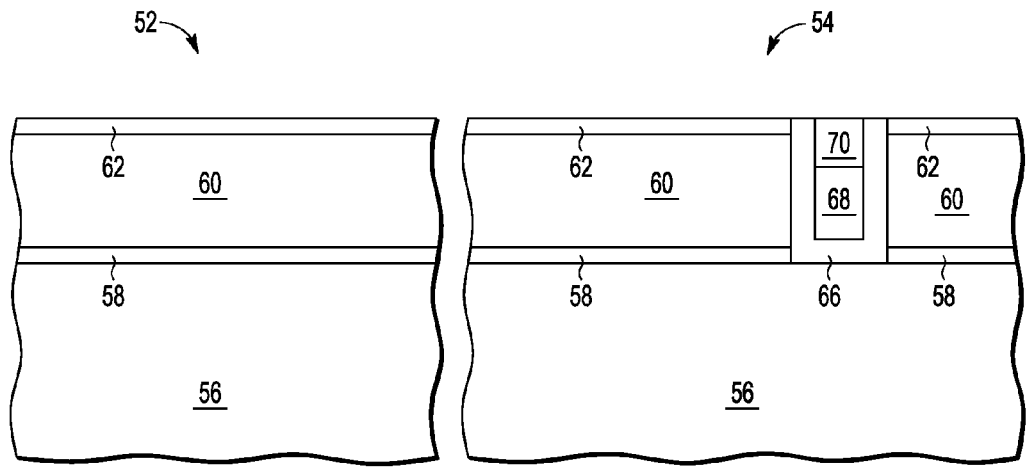

FIG. 17 illustrates, in cross-sectional form, semiconductor device 50, for the case where control gate 68 is formed from polysilicon, after performing a silicidation step which results in a metal silicide 70 in a top layer of control gate 68. The silicidation step may be performed by applying a layer of nickel, applying heat to form nickel silicide on the top portion of control gate 68, and then removing the nickel that was not on polysilicon. If control gate 68 is formed from a layer that itself is metallic, the silicidation step is not needed. In either case, the result is that the top surface of control gate 68 is metallic. Control gate 68 thus has an etch selectivity to layer 60 either due to the surface of control gate being metallic or control gate 68 being entirely metallic.

Figure 18:
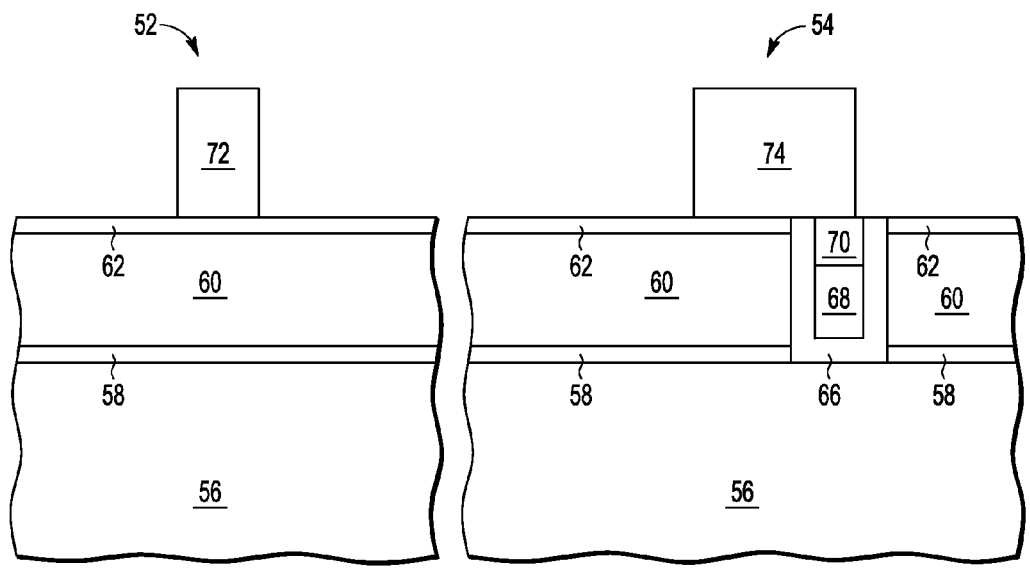

FIG. 18 illustrates, in cross-sectional form, semiconductor device 50 after forming a photoresist mask pattern 72 over layer 60 (and hard mask 62) in logic portion 52 and a photoresist mask pattern 74 having a first edge over layer 60 (and hard mask 62) spaced from a second edge that is over control gate 68. The location of the first edge is important in defining a select gate and thus may be considered a critical edge. The second edge should be over metal silicide 70 which gives it a relatively wide tolerance for being located properly. The second edge may also be located over the vertical portion of charge storage layer 66. It may be beneficial to form mask patterns 72 and 74 in different steps.

Figure 19:
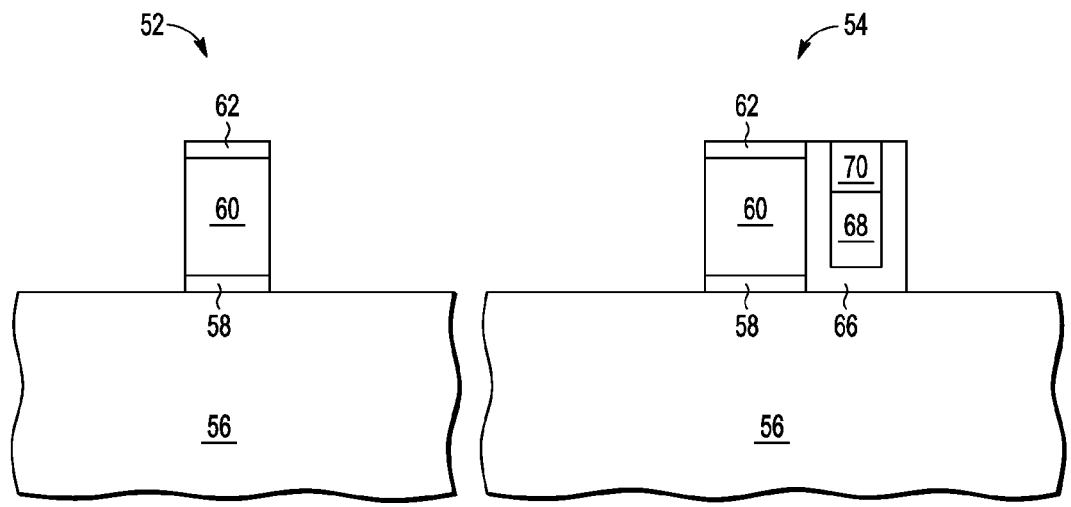

FIG. 19 illustrates, in cross-sectional form, semiconductor device 50 after selectively removing layer 60 according to the photoresist mask patterns 72 and 74. Remaining layer 60 in logic region 52 will function as a dummy logic gate that will subsequently be replaced by a metal logic gate. Remaining layer 60 in NVM portion 54 may be used as a dummy gate to be replaced by a metal select gate. Note that portions of dielectric layer 58 not covered by mask patterns 72 and 74 are also removed; however, in other embodiments, these portions may be removed during subsequent processing. Also, a portion of hard mask 62 may remain on the dummy logic gate and dummy select gate.

Figure 20:
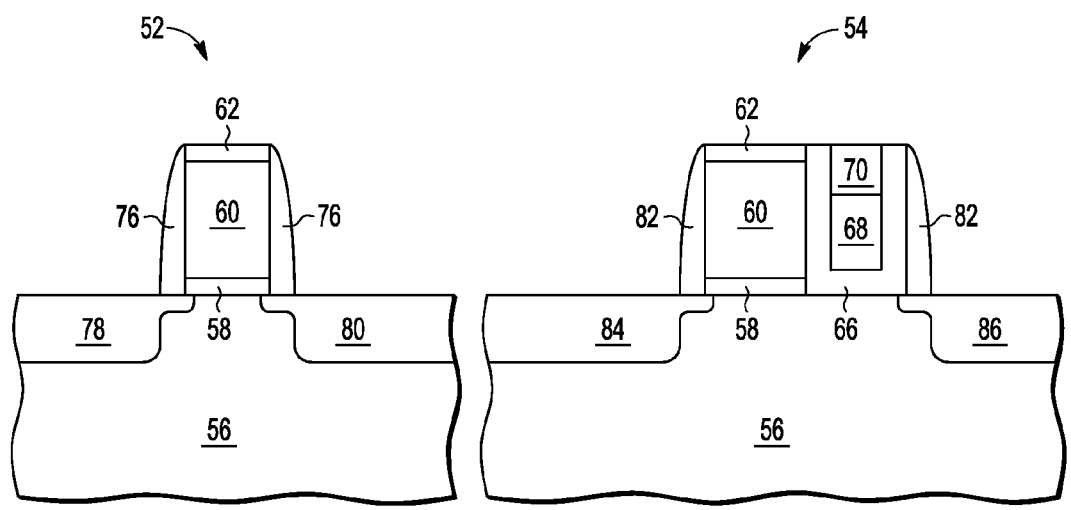

FIG. 20 illustrates, in cross-sectional form, semiconductor device 50 after formation of a sidewall spacer 76 around dummy gate 60, source/drain regions 78 and 80 in substrate 56 adjacent dummy gate 60, sidewall spacer 82 around the select and control gates, source/drain region 84 in substrate 56 adjacent select gate 60, and source/drain region 86 in substrate 56 adjacent control gate 68. In one embodiment, a shallow implant is performed into substrate 56 to form extension regions of each of source/drain regions 78, 80, 84, and 86. Subsequently, spacers 76 and 82 may be formed by depositing a layer of dielectric material and then performing an anisotropic etch. After formation of spacers 76 and 82, a deep implant may be performed into substrate 56 to form source/drain regions 78, 80, 84, and 86.

Figure 21:
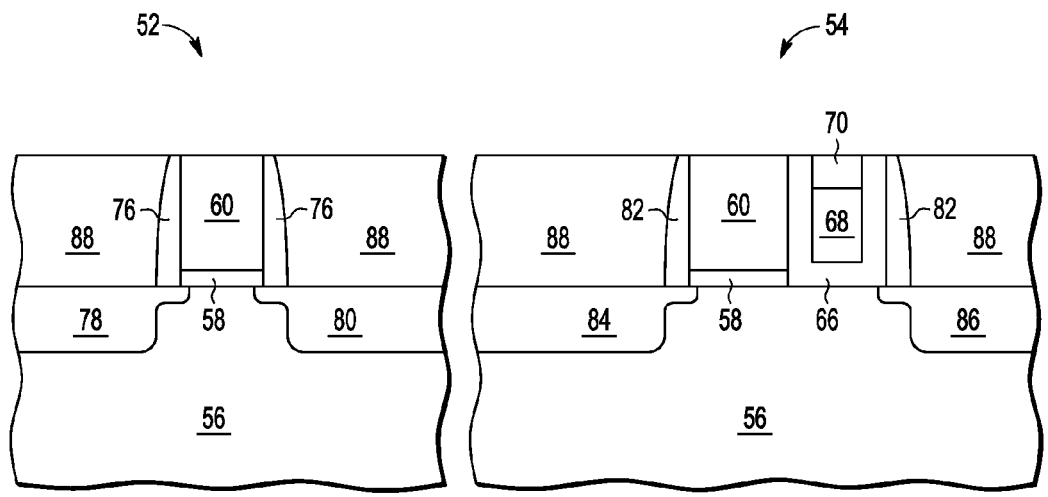

FIG. 21 illustrates, in cross-sectional form, semiconductor device 50 after formation of an interlayer dielectric (ILD) 88 around dummy gate 60 in logic region 52 and the select and control gates in NVM region 54. ILD 88 is planarized to be coplanar with top surfaces of dummy gates 60 and control gate 68, thus exposing dummy gates 60 (both the logic dummy gate in logic region 52 and select dummy gate in NVM region 54). Therefore, the planarization also removes the remaining portions of hard mask 62 from the tops of dummy gates 60 so as to expose dummy gates 60. Alternatively, hard mask 62 may be removed earlier in the process, but may be beneficial to be present during the silicidation of control gate 68. ILD 40 may be, for example, a low-k material or an oxide.

Figure 22:
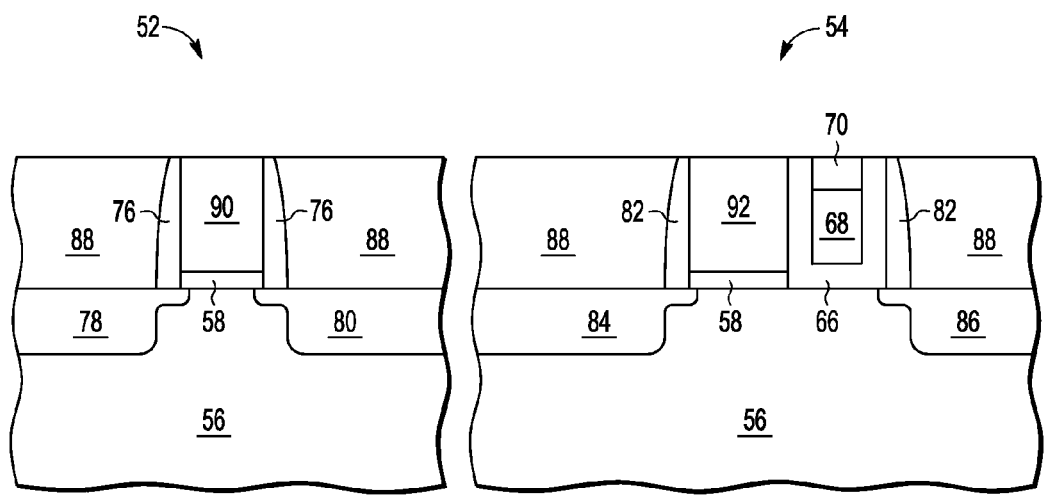

FIG. 22 illustrates, in cross-sectional form, semiconductor device 50 after replacing dummy gates 60 with metallic gates. Dummy gate 60 in logic region 52 may be replaced with a metallic logic gate 90 and dummy gate 60 in NVM region 54 may be replaced with a metallic select gate 92. In one embodiment, after removal of dummy gates 60, a metal layer may be formed over ILD 88 and within the openings resulting from the removal of dummy gates 60, followed by an etchback or CMP to result in the metallic gates. Therefore, a high-k first metal gate last replacement process may be used to form a high-k dielectric and metal gate for both the logic gate and select gate.

Figure 23:
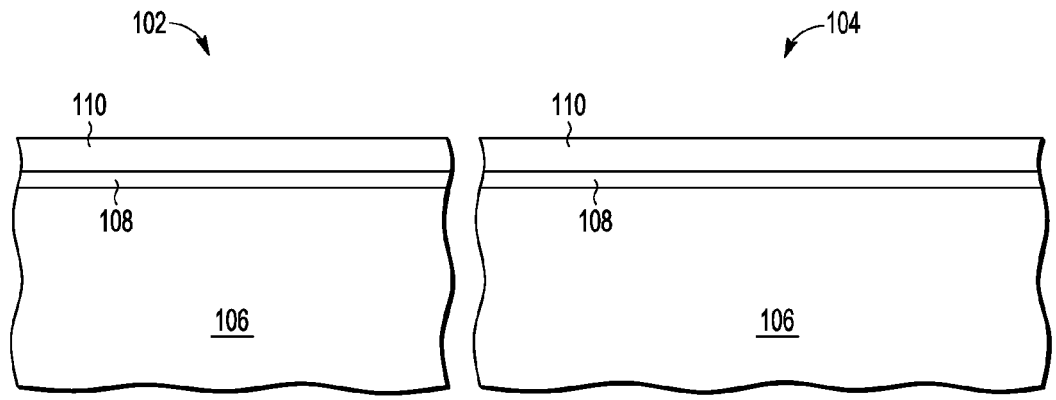
FIGS. 23-35 illustrate, in cross-sectional view, a semiconductor device at various processing stages in accordance with one embodiment of the present invention.

FIG. 23 illustrates, in cross-sectional form, a semiconductor device 100 having a logic region 102 and an NVM region 104 with a substrate 106, a dielectric layer 108 that may be thermal oxide formed on substrate 106, and a thin polysilicon layer 110 formed over dielectric layer 108. Dielectric layer 108 may be an oxynitride. Thin polysilicon layer 110 may be referred to as a first gate material layer, and may be another gate material other than polysilicon. Semiconductor substrate 106 can be any semiconductor material or combinations of materials, such as gallium arsenide, silicon germanium, silicon-on-insulator (SOI), silicon, monocrystalline silicon, the like, and combinations of the above.

Figure 24:
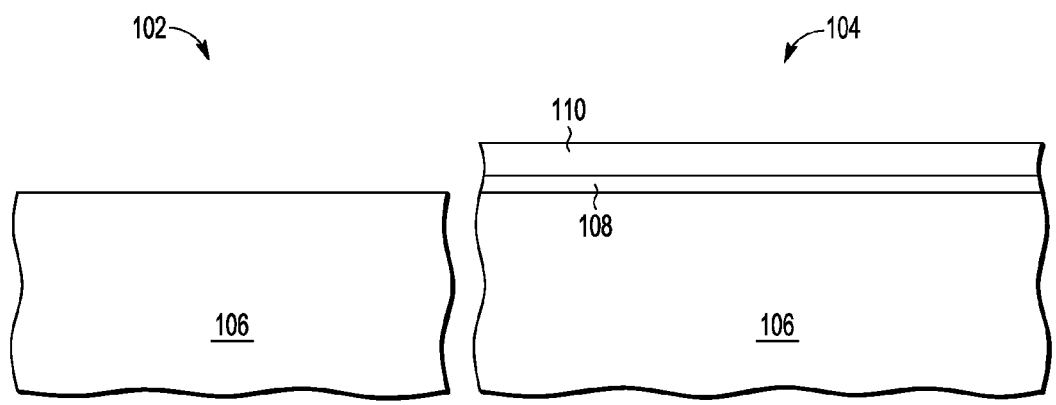

FIG. 24 illustrates, in cross-sectional form, semiconductor device 100 after removing thin polysilicon layer 110 and dielectric layer 108 from logic region 102. A masking layer, such as photo resist, may be used to protect NVM region 104 during the removal of layers 110 and 108 from logic region 102. The masking layer may be subsequently removed.

Figure 25:
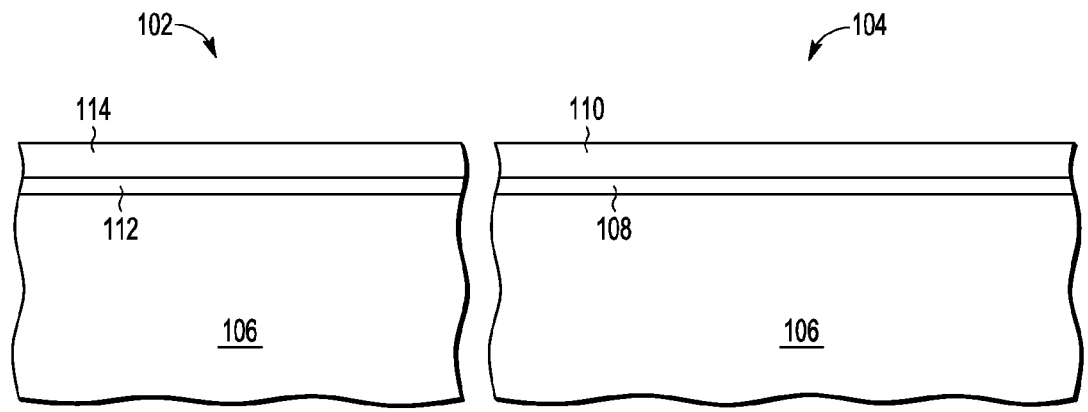

FIG. 25 illustrates, in cross-sectional form, semiconductor device 100 after forming a high-k dielectric layer 112 and a barrier layer 114 in logic region 102. A high-k dielectric layer 112 may be deposited over substrate 106 in logic region 102 and over layer 110 in NVM region 104, and barrier layer 114 may be deposited over high-k dielectric layer 112 in logic region 102 and NVM region 104. High-k dielectric layer 112 and barrier layer 114 may then be removed from NVM region 104. A patterned etch may be performed to remove these layers from NVM region 104.

In one embodiment, a combined thickness of high-k dielectric layer 112 and barrier layer 114 in logic region 102 is similar to a combined thickness of dielectric layer 108 and thin polysilicon layer 110 in NVM region 104. In this manner, the step size between layers 114 and 110 at the boundaries between logic region 102 and NVM region 104 is minimized. This may help prevent subsequent CMP complications, such as unwanted dishing.

Figure 26:
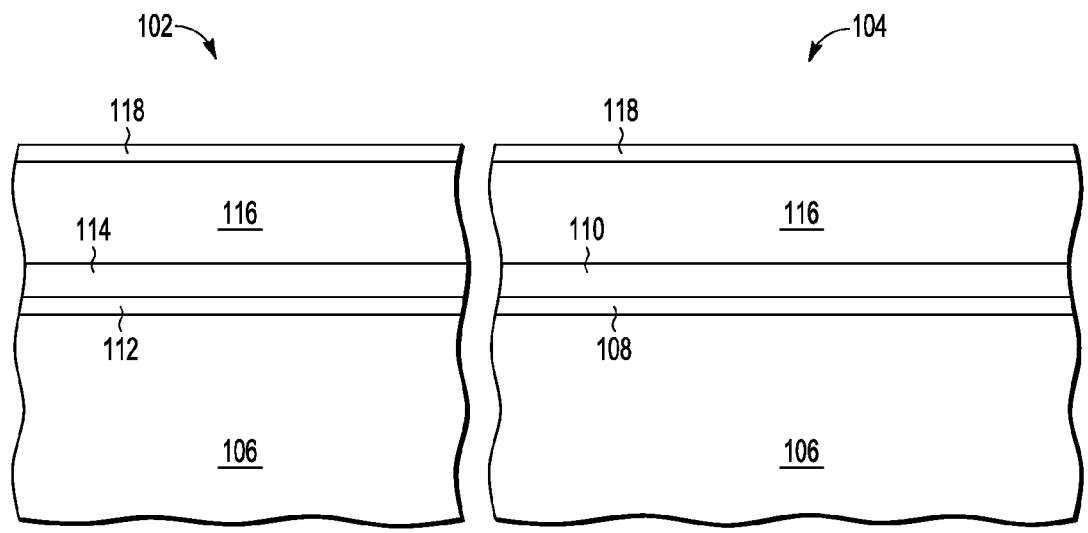

FIG. 26 illustrates, in cross-sectional form, semiconductor device 100 after formation of a thick polysilicon layer 116 over barrier layer 114 in logic region 102 and over thin polysilicon layer 110 in NVM region 104. A hard mask 118, which may be a nitride, is formed over thick polysilicon layer 116. Thick polysilicon layer 116 may be referred to as a second gate material layer, and may be another gate material other than polysilicon. In one embodiment, thick polysilicon layer 116 is thicker than thin polysilicon layer 110. For example, thin polysilicon layer 110 may have a thickness in a range of 4 to 10 nanometers, and thick polysilicon layer 116 may have a thickness in a range of 20 to 80 nanometers.

Figure 27:
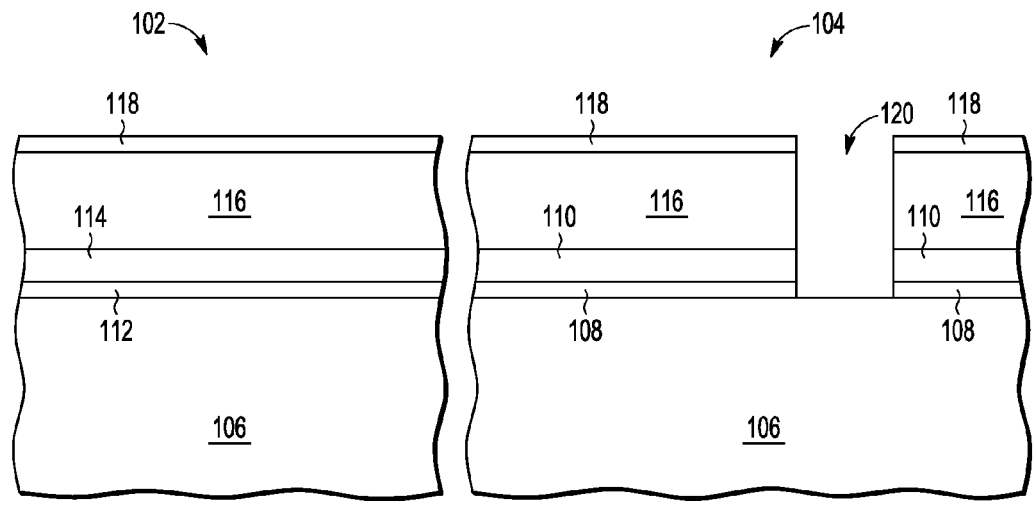

FIG. 27 illustrates, in cross-sectional form, semiconductor device 100 after forming a control gate opening 120 in NVM region 104 through hard mask 118, thick polysilicon layer 116, thin polysilicon layer 110, and dielectric layer 108. Opening 120 is shown stopping at the top surface of substrate 106, but it may extend into substrate 106.

Figure 28:
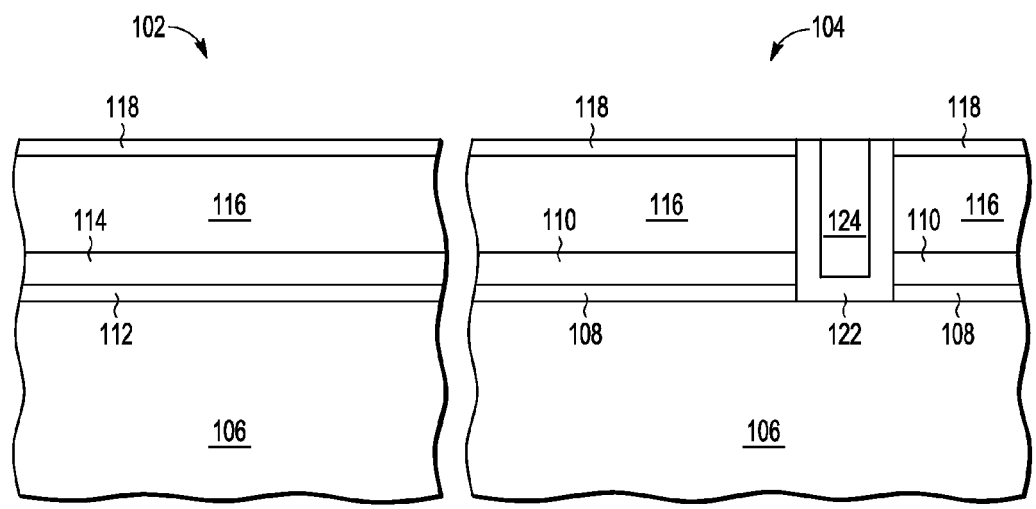

FIG. 28 illustrates, in cross-sectional form, semiconductor device 100 after forming a charge storage layer 122 and a control gate 124 on charge storage layer 122 in opening 120. Charge storage layer 122 may be a layer of nanocrystals surrounded by an insulating material such as oxide and may be formed by bottom grown or deposited dielectric, silicon deposition and anneal that forms nanocrystals, and deposited top dielectric. This may be followed by depositing a layer of control gate material and performing a planarizing step that may be an etchback or chemical mechanical polishing (CMP).

Figure 29:
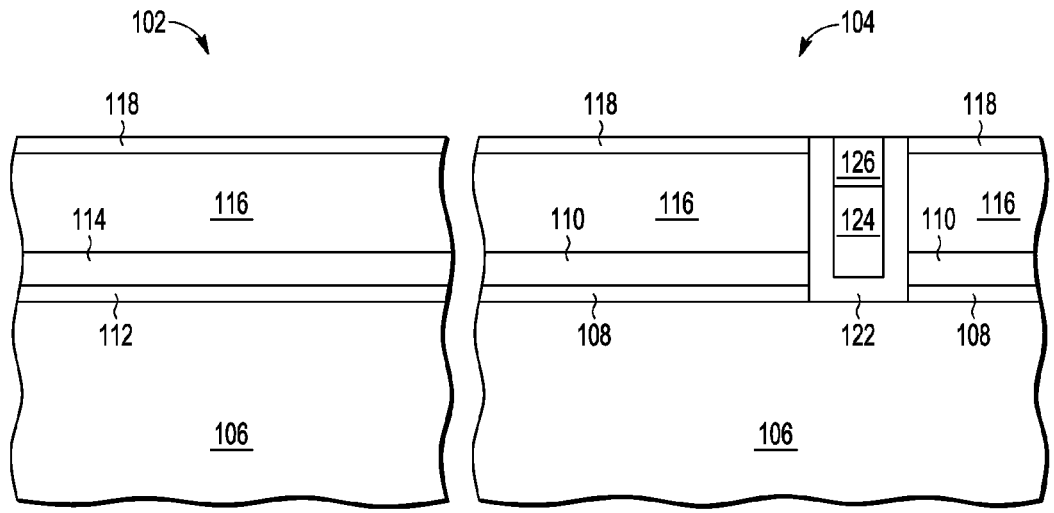

FIG. 29 illustrates, in cross-sectional form, semiconductor device 100, for the case where control gate 124 is formed from polysilicon, after performing a silicidation step which results in a metal silicide 126 in a top layer of control gate 124. The silicidation step may be performed by applying a layer of nickel, applying heat to form nickel silicide on the top portion of control gate 124, and then removing the nickel that was not on polysilicon. If control gate 124 is formed from a layer that itself is metallic, the silicidation step is not needed. In either case, the result is that the top surface of control gate 124 is metallic. Control gate 124 thus has an etch selectivity to layer 116 either due to the surface of control gate being metallic or control gate 124 being entirely metallic.

Figure 30:
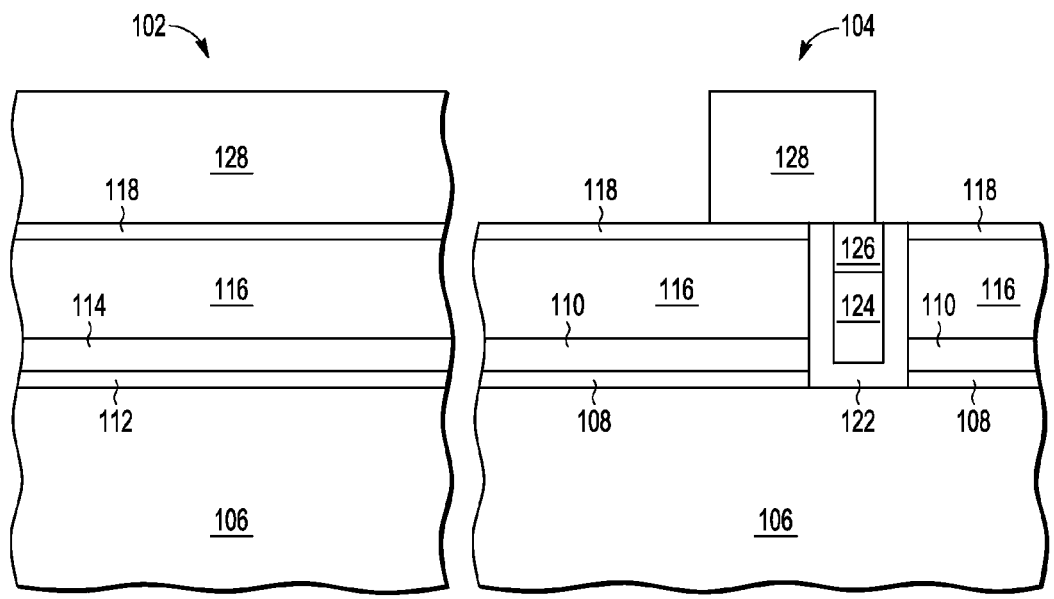

FIG. 30 illustrates, in cross-sectional form, semiconductor device 100 after forming a patterned masking layer 128 over layer 116. Patterned masking layer 128 includes a first portion which covers logic region 102 and a second portion in NVM region 104 which defines the location of a select gate adjacent a control gate. That is, note that the left edge of the second portion defines the location of a left edge of the select gate, and the right edge of the second portion defines the location of a right edge of the control gate, as will be described in further detail below. That is, note that patterned masking layer 128 in NVM region 104 extends from a first edge (e.g. the right edge) which is over the control gate to a second edge (e.g. the left edge), in which the second edge is spaced from the left edge of opening 120 which now contains charge storage layer 122 and control gate 124.

Figure 31:
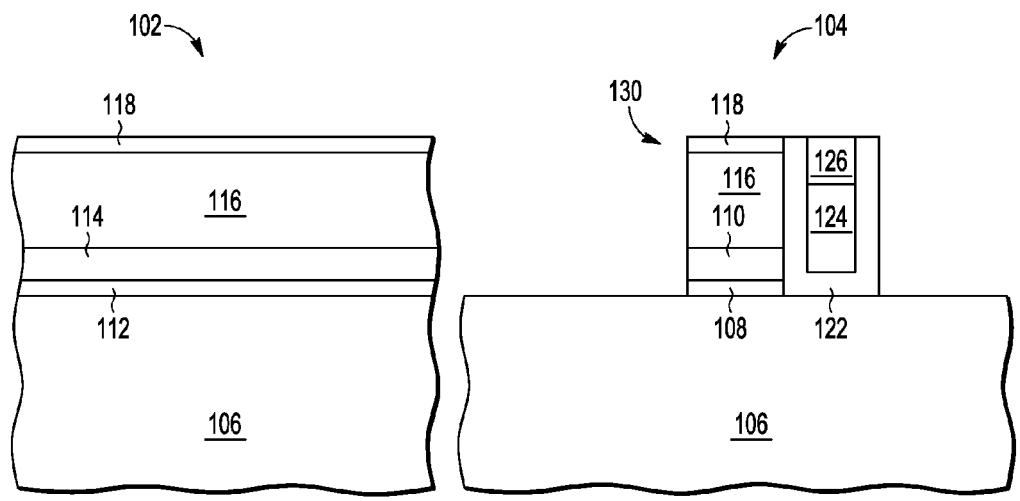

FIG. 31 illustrates, in cross-sectional form, semiconductor device 100 after patterning layer 116 and 110 in NVM region 104 using patterned masking layer 128 while layer 116 remains protected in logic region 102. Therefore, in NVM region 104, a portion of gate material layers 110 and 116 remain adjacent control gate 124. This remaining portion of layers 110 and 116 may function as a select gate 130 in which the select gate includes a first and second layer of gate material. Note that a portion of charge storage layer 122 is located between adjacent sidewalls of select gate 130 and control gate 124. Dielectric layer 108 in NVM region 104 not covered by remaining portions of layers 110 and 116 is shown as being removed but it could remain at this point and get removed in subsequent sidewall spacer formation and associated processing.

Figure 32:
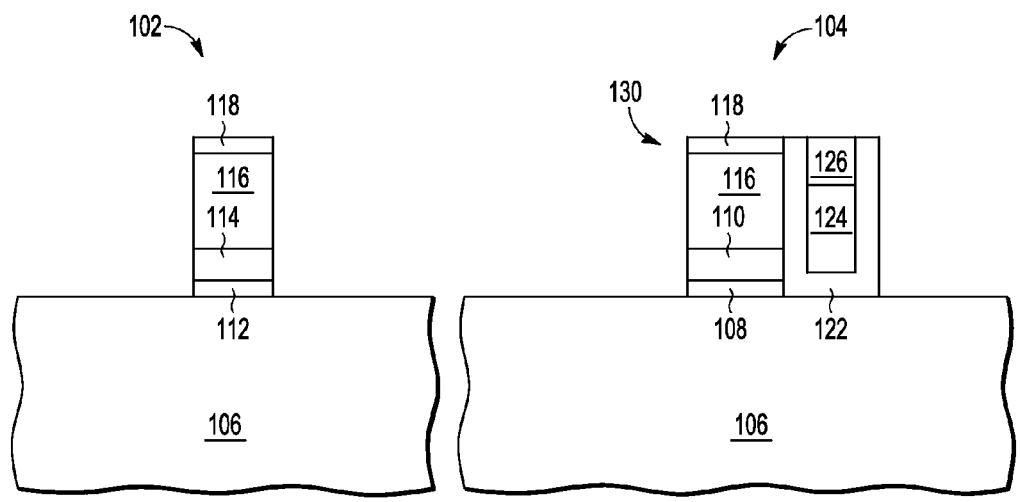

FIG. 32 illustrates, in cross-sectional form, semiconductor device 100 after forming a dummy logic gate in logic region 102. In one embodiment, a patterned masking layer is formed having a first portion in logic region 102 over thick polysilicon layer 116 (and hard mask 118) which defines the location of the dummy logic gate. The dummy logic gate may refer to the remaining portion of thick polysilicon layer 116 in logic region 102 which will subsequently be replaced. The patterned masking layer may have a second portion that is over select gate 130 and control gate 124 in NVM region 104 to protect NVM region 104 during the formation of the dummy logic gate. In logic region 102, high-k dielectric layer 112 and barrier layer 114 not covered by the patterned masking layer are also removed.

Figure 33:
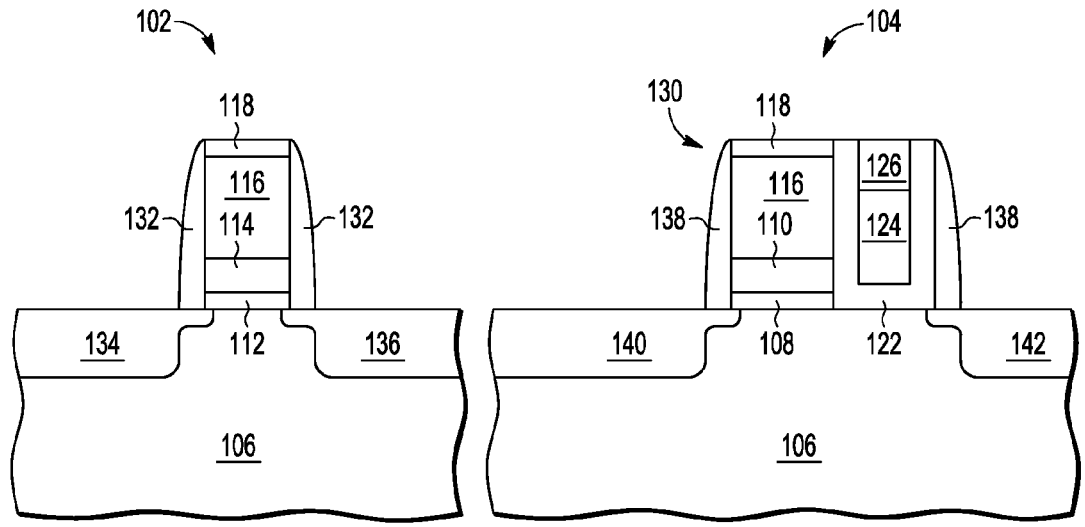

FIG. 33 illustrates, in cross-sectional form, semiconductor device 100 after formation of a sidewall spacer 132 around the dummy logic gate, source/drain regions 134 and 136 in substrate 106 adjacent the dummy gate, sidewall spacer 138 around the select and control gates, source/drain region 140 in substrate 106 adjacent select gate 130, and source/drain region 142 in substrate 106 adjacent control gate 124. In one embodiment, a shallow implant is performed into substrate 106 to form extension regions of each of source/drain regions 134, 136, 140, and 142. Subsequently, spacers 132 and 138 may be formed by depositing a layer of dielectric material and then performing an anisotropic etch. After formation of spacers 132 and 138, a deep implant may be performed into substrate 106 to form source/drain regions 134, 136, 140, and 142.

Figure 34:
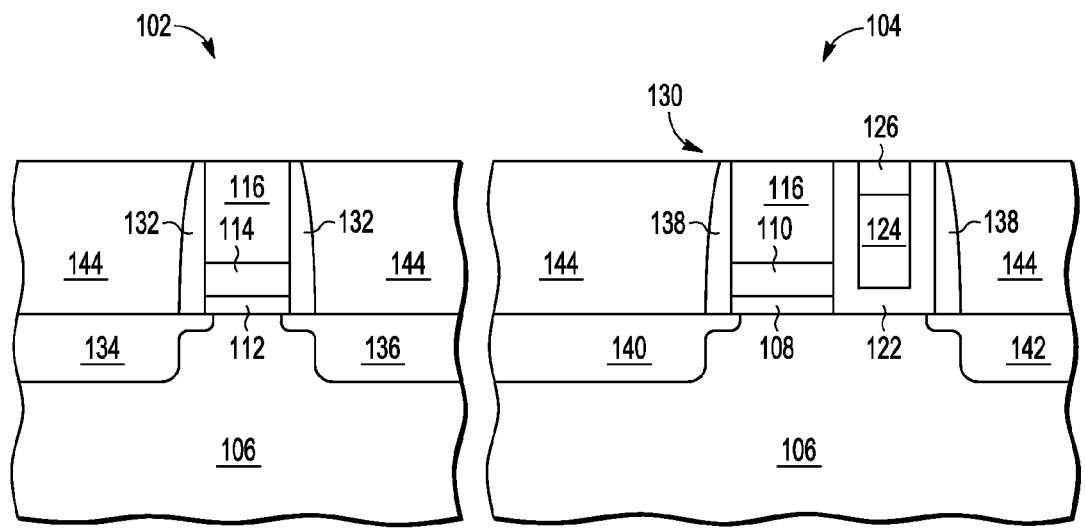

FIG. 34 illustrates, in cross-sectional form, semiconductor device 100 after formation of an interlayer dielectric (ILD) 144 around the dummy gate in logic region 102 and the select and control gates in NVM region 104. ILD 144 is planarized to be coplanar with top surfaces of the dummy logic gate, select gate 130, and control gate 124, thus exposing thick polysilicon layer 116 of the dummy logic gate. Therefore, the planarization also removes the remaining portions of hard mask 118 from the top of thick polysilicon layer 116 so as to expose thick polysilicon layer 116 of the dummy logic gate. Alternatively, hard mask 118 may be removed earlier in the process, but may beneficially be present during the silicidation of control gate 124. ILD 144 may be, for example, a low-k material or an oxide.

Figure 35:
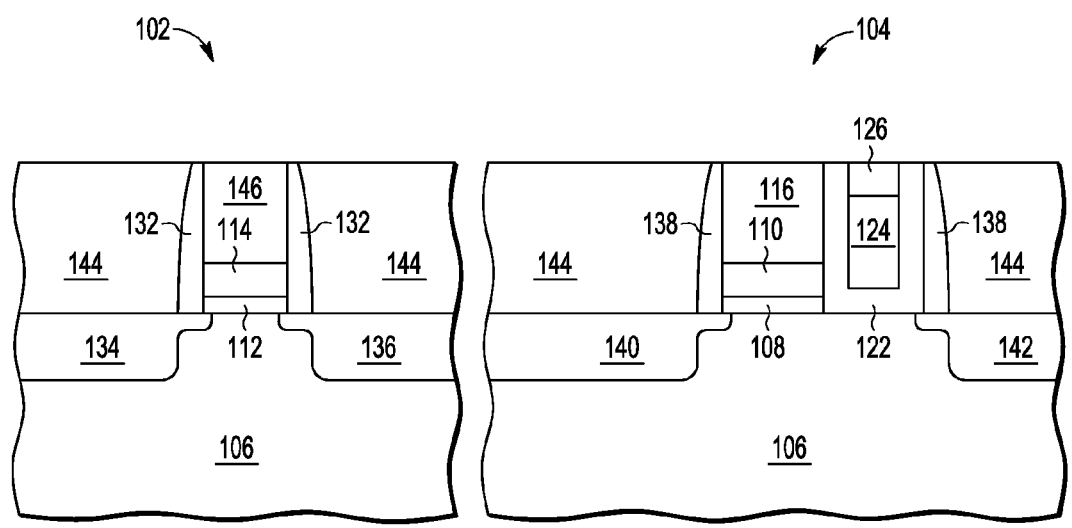

FIG. 35 illustrates, in cross-sectional form, semiconductor device 100 after replacing the dummy logic gate with a metallic logic gate 146. In one embodiment, thick polysilicon layer 116 is removed from logic region 102 while NVM region 104 remains protected, such as by a masking layer. A metal layer may then be formed over ILD 144 and within the opening resulting from the removal of thick polysilicon from the dummy gate in logic region 102, followed by an etchback or CMP to result in metallic logic gate 146. Therefore, high-k first metal gate last replacement process may be used to form a high-k dielectric and metal gate for the logic gate while allowing the select gate to remain polysilicon over a thermal oxide dielectric.

Therefore, by now it should be understood how various integrations of an NVM cell and logic transistor can achieve different combinations of materials for the dielectrics and gates in both the logic transistor and NVM cell. For example, a high-k first metal gate last replacement process may be used to form a high-k dielectric and metal gate for the logic gate stack and select gate stack. In another embodiment, a high-k first metal gate last replacement process may be used to form a high-k dielectric and metal gate for the logic gate stack, while allowing the select gate to remain polysilicon over a high-k dielectric. In another embodiment, a high-k first metal gate last replacement process may be used to form a high-k dielectric and metal gate for the logic gate stack, while allowing the select gate to remain polysilicon over a thermal oxide dielectric. In this manner, logic and NVM can be efficiently integrated within a single integrated circuit.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different types of materials may be used for the charge storage layer. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method of forming a semiconductor device in an NVM (non-volatile memory) region and in a logic region using a semiconductor substrate, includes forming a gate material layer over the substrate in the NVM region and the logic region; patterning the gate material layer over the NVM region to form a control gate opening, the control gate opening having an exposed surface; forming a charge storage layer over the exposed surface; forming a control gate in the control gate opening over the charge storage layer; removing the gate material layer from the logic region; forming a high-k layer over the substrate in the logic region; forming a dummy gate layer over the high-k layer; patterning the gate material layer over the NVM region to leave a select gate adjacent to the control gate; patterning the dummy gate layer to leave a dummy gate over the high-k layer; forming an interlayer dielectric around the dummy gate and around the control gate and select gate; and replacing the dummy gate with a metallic logic gate. In a further aspect, the forming the control gate includes depositing a polysilicon layer, planarizing the polysilicon layer, and siliciding a top surface of the polysilicon layer. In another further aspect, the forming the control gate comprises depositing a layer comprising metal. In another further aspect, the method further includes forming a hard mask layer over the gate material layer prior to forming the control gate opening. In another further aspect, the patterning the gate layer material includes forming a patterned masking layer that extends from a first edge of the patterned masking layer to a second edge of the patterned masking layer, wherein the first edge has a characteristic comprising being over one of a group consisting of the control gate and the charge storage layer and the second edge is spaced from an edge of the control gate opening that contains the control gate and the charge storage layer. In yet a further aspect, the forming the gate layer material includes depositing a polysilicon layer. In another further aspect of the above embodiment, the patterning the gate material layer is further characterized by extending the control gate opening into the substrate.

In another embodiment, a method of forming a semiconductor device in an NVM region and in a logic region using a semiconductor substrate, includes forming a first layer over the substrate in the NVM region and the logic region, wherein the first layer comprises a high-k dielectric over the substrate and a barrier layer over the high-k dielectric in the NVM and logic region; forming a dummy gate material layer over the barrier layer; patterning the dummy gate material layer over the NVM region to form a control gate opening, the control gate opening having an exposed surface; forming a charge storage layer over the exposed surface; forming a control gate in the control gate opening over the charge storage layer; patterning the dummy gate material layer over the NVM region and the logic region to leave a dummy select gate adjacent to the control gate in the NVM region and a dummy logic gate in the logic region; forming an interlayer dielectric around the dummy logic gate and around the control gate and the dummy select gate; and replacing the dummy logic gate with a metallic logic gate and the dummy select gate with a metallic select gate. In a further aspect, the forming the control gate includes depositing a polysilicon layer, planarizing the polysilicon layer, and siliciding a top surface of the polysilicon layer. In another further aspect, the forming the control gate comprises depositing a layer comprising metal. In yet a further aspect, the method further includes forming a hard mask layer over the dummy gate material layer prior to forming the control gate opening. In yet an even further aspect, the patterning the dummy gate material layer includes forming a first patterned masking layer that extends from a first edge of the patterned masking layer to a second edge of the patterned masking layer, wherein the first edge has a characteristic comprising being over one of the group consisting of the control gate and the charge storage layer, and the second edge is spaced from an edge of the control gate opening that contains the control gate and the charge storage layer. In another aspect of the above embodiment, the patterning the gate material layer is further characterized by extending the control gate opening into the substrate.

In yet another embodiment, method of forming a semiconductor device in an NVM (non-volatile memory) region and in a logic region using a semiconductor substrate, includes forming a dielectric layer over the substrate in the NVM region and the logic region; forming a first gate material layer over the dielectric layer in the NVM region and the logic region; removing the dielectric layer and the first gate material layer from the logic region; forming, in the logic region, a high-k dielectric over the substrate and a barrier layer over the high-k dielectric; forming a second gate material layer over the barrier layer in the logic region and the first gate material layer in the NVM region; patterning the first gate material layer and the second gate material layer over the NVM region to form a control gate opening, the control gate opening having an exposed surface; forming a charge storage layer over the exposed surface; forming a control gate in the control gate opening over the charge storage layer; patterning the first gate material layer and the second gate material layer over the NVM region to leave a select gate adjacent to the control gate; patterning the second gate material layer and the barrier layer to leave a stack comprising a portion of the second gate material layer and a portion of the barrier layer aligned to the portion of the second gate material layer; forming an interlayer dielectric around the stack and around the control gate and select gate; and replacing the portion of the second gate material with a metallic logic gate. In a further aspect, the forming the control gate includes depositing a polysilicon layer, planarizing the polysilicon layer, and siliciding a top surface of the polysilicon layer. In another further aspect, the forming the control gate includes depositing a layer comprising metal. In another further aspect, the method further includes forming a hard mask layer over the gate material layer prior to forming the control gate opening. In another further aspect, the patterning the gate layer material includes forming a patterned masking layer that extends from a first edge of the patterned masking layer to a second edge of the patterned masking layer, wherein the first edge has a characteristic comprising being over one of a group consisting of the control gate and the charge storage layer and the second edge is spaced from an edge of the control gate opening that contains the control gate and the charge storage layer. In yet a further aspect, the forming the first gate material layer comprises depositing a first polysilicon layer and the forming the second gate material layer includes forming a second polysilicon layer, wherein the second polysilicon layer is thicker than the first polysilicon layer. In another further aspect of the above embodiment, the patterning the first gate material layer and the second gate material layer over the NVM region to form a control gate opening is further characterized by extending the control gate opening through the dielectric layer and into the substrate.

What is claimed is:

1. A method of forming a semiconductor device in an NVM (non-volatile memory) region and in a logic region using a semiconductor substrate, comprising:
    forming a gate material layer over the substrate in the NVM region and the logic region;
    patterning the gate material layer over the NVM region to form a control gate opening, the control gate opening having an exposed surface;

forming a charge storage layer over the exposed surface;
forming a control gate in the control gate opening over the charge storage layer;
removing the gate material layer from the logic region;
forming a high-k layer over the substrate in the logic region;
forming a dummy gate layer over the high-k layer;
patterning the gate material layer over the NVM region to leave a select gate adjacent to the control gate;
patterning the dummy gate layer to leave a dummy gate over the high-k layer;
forming an interlayer dielectric around the dummy gate and around the control gate and select gate; and
replacing the dummy gate with a metallic logic gate.

2. The method of claim 1, wherein the forming the control gate comprises:
depositing a polysilicon layer, planarizing the polysilicon layer, and siliciding a top surface of the polysilicon layer.

3. The method of claim 1, wherein the forming the control gate comprises depositing a layer comprising metal.

4. The method of claim 1, further comprising;
forming a hard mask layer over the gate material layer prior to forming the control gate opening.

5. The method of claim 1, wherein the patterning the gate layer material comprises:
forming a patterned masking layer that extends from a first edge of the patterned masking layer to a second edge of the patterned masking layer, wherein the first edge has a characteristic comprising being over one of a group consisting of the control gate and the charge storage layer and the second edge is spaced from an edge of the control gate opening that contains the control gate and the charge storage layer.

6. The method of claim 5, wherein the forming the gate layer material comprises depositing a polysilicon layer.

7. The method of claim 1, wherein the patterning the gate material layer is further characterized by extending the control gate opening into the substrate.

8. A method of forming a semiconductor device in an NVM region and in a logic region using a semiconductor substrate, comprising:
forming a first layer over the substrate in the NVM region and the logic region, wherein the first layer comprises a high-k dielectric over the substrate and a barrier layer over the high-k dielectric in the NVM and logic region;
forming a dummy gate material layer over the barrier layer;
patterning the dummy gate material layer over the NVM region to form a control gate opening, the control gate opening having an exposed surface;
forming a charge storage layer over the exposed surface;
forming a control gate in the control gate opening over the charge storage layer;
patterning the dummy gate material layer over the NVM region and the logic region to leave a dummy select gate adjacent to the control gate in the NVM region and a dummy logic gate in the logic region;
forming an interlayer dielectric around the dummy logic gate and around the control gate and the dummy select gate; and
replacing the dummy logic gate with a metallic logic gate and the dummy select gate with a metallic select gate.

9. The method of claim 8, wherein the forming the control gate comprises:
depositing a polysilicon layer, planarizing the polysilicon layer, and siliciding a top surface of the polysilicon layer.

10. The method of claim 8, wherein the forming the control gate comprises depositing a layer comprising metal.

11. The method of claim 10, further comprising;
forming a hard mask layer over the dummy gate material layer prior to forming the control gate opening.

12. The method of claim 11, wherein the patterning the dummy gate material layer comprises:
forming a first patterned masking layer that extends from a first edge of the patterned masking layer to a second edge of the patterned masking layer, wherein the first edge has a characteristic comprising being over one of the group consisting of the control gate and the charge storage layer, and the second edge is spaced from an edge of the control gate opening that contains the control gate and the charge storage layer.

13. The method of claim 8, wherein the patterning the gate material layer is further characterized by extending the control gate opening into the substrate.

14. A method of forming a semiconductor device in an NVM (non-volatile memory) region and in a logic region using a semiconductor substrate, comprising:
forming a dielectric layer over the substrate in the NVM region and the logic region;
forming a first gate material layer over the dielectric layer in the NVM region and the logic region;
removing the dielectric layer and the first gate material layer from the logic region;
forming, in the logic region, a high-k dielectric over the substrate and a barrier layer over the high-k dielectric;
forming a second gate material layer over the barrier layer in the logic region and the first gate material layer in the NVM region;
patterning the first gate material layer and the second gate material layer over the NVM region to form a control gate opening, the control gate opening having an exposed surface;
forming a charge storage layer over the exposed surface;
forming a control gate in the control gate opening over the charge storage layer;
patterning the first gate material layer and the second gate material layer over the NVM region to leave a select gate adjacent to the control gate;
patterning the second gate material layer and the barrier layer to leave a stack comprising a portion of the second gate material layer and a portion of the barrier layer aligned to the portion of the second gate material layer;
forming an interlayer dielectric around the stack and around the control gate and select gate; and
replacing the portion of the second gate material with a metallic logic gate.

15. The method of claim 14, wherein the forming the control gate comprises:
depositing a polysilicon layer, planarizing the polysilicon layer, and siliciding a top surface of the polysilicon layer.

16. The method of claim 14, wherein the forming the control gate comprises depositing a layer comprising metal.

17. The method of claim 14, further comprising;
forming a hard mask layer over the gate material layer prior to forming the control gate opening.

18. The method of claim 14, wherein the patterning the gate layer material comprises:
forming a patterned masking layer that extends from a first edge of the patterned masking layer to a second edge of the patterned masking layer, wherein the first edge has a characteristic comprising being over one of a group consisting of the control gate and the charge storage layer and the second edge is spaced from an edge of the control gate opening that contains the control gate and the charge storage layer.

19. The method of claim 18, wherein the forming the first gate material layer comprises depositing a first polysilicon layer and the forming the second gate material layer comprises forming a second polysilicon layer, wherein the second polysilicon layer is thicker than the first polysilicon layer.

20. The method of claim 14, wherein the patterning the first gate material layer and the second gate material layer over the NVM region to form a control gate opening is further characterized by extending the control gate opening through the dielectric layer and into the substrate.

* * * * *